(12) United States Patent
Dixon et al.

(10) Patent No.: US 6,914,428 B2
(45) Date of Patent: Jul. 5, 2005

(54) MAGNETIC RESONANCE IMAGING SYSTEMS AND METHODS FOR ACQUIRING MULTI-SLICE GRADIENT ECHO IMAGES

(75) Inventors: William Dixon, Clifton Park, NY (US); Daniel Blezek, Niskayuna, NY (US); Paritosh Dhawale, Selkirk, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/219,883

(22) Filed: Aug. 15, 2002

(65) Prior Publication Data

US 2004/0032259 A1 Feb. 19, 2004

(51) Int. Cl.⁷ .............................................. G01V 3/00
(52) U.S. Cl. ...................................................... 324/307
(58) Field of Search ................................ 324/307–309; 600/410

(56) References Cited

U.S. PATENT DOCUMENTS

| | | | | |
|---|---|---|---|---|
| 4,694,252 A | * | 9/1987 | Riederer et al. | 324/309 |
| 4,698,593 A | * | 10/1987 | Crooks | 324/309 |
| 4,825,160 A | * | 4/1989 | Kuhn | 324/309 |
| 5,154,178 A | * | 10/1992 | Shah | 600/415 |
| 5,416,412 A | * | 5/1995 | Slayman et al. | 324/314 |
| 5,429,134 A | * | 7/1995 | Foo | 600/413 |
| 5,459,400 A | * | 10/1995 | Moonen | 324/309 |
| 6,016,057 A | | 1/2000 | Ma | 324/309 |
| 6,064,203 A | * | 5/2000 | Bottomley | 324/309 |
| 6,134,464 A | * | 10/2000 | Tan et al. | 600/410 |
| 6,147,492 A | * | 11/2000 | Zhang et al. | 324/309 |
| 6,219,571 B1 | * | 4/2001 | Hargreaves et al. | 600/410 |
| 6,263,228 B1 | | 7/2001 | Zhang et al. | 600/409 |
| 6,272,369 B1 | | 8/2001 | Tan | 600/410 |
| 6,288,543 B1 | * | 9/2001 | Listerud et al. | 324/309 |
| 6,291,996 B1 | * | 9/2001 | Glover et al. | 324/309 |
| 6,380,738 B1 | * | 4/2002 | Zhou | 324/309 |
| 6,472,871 B2 | * | 10/2002 | Ryner | 324/307 |
| 6,564,080 B1 | * | 5/2003 | Kimura | 600/410 |
| 6,603,311 B2 | | 8/2003 | Ogino | 324/309 |
| 6,603,989 B1 | | 8/2003 | Yablonskiy | 600/410 |
| 2002/0171423 A1 | * | 11/2002 | Heidenreich | 324/307 |

* cited by examiner

*Primary Examiner*—Louis Arana
*Assistant Examiner*—Dixomara Vargas
(74) *Attorney, Agent, or Firm*—Cantor Colburn LLP

(57) ABSTRACT

Magnetic resonance imaging ("MRI") systems and methods for acquiring multi-slice gradient echo images having a substantially constant T1-weighting including selecting a first scan having a desired contrast associated with T1-weighting and, given a first repetition time, TR1, and a first flip angle, flip1, associated with the first scan, selecting an effective repetition time, TReff, that provides the desired contrast. The MRI systems and methods also including holding the effective repetition time, TReff, substantially constant in relation to a second scan. The MRI systems and methods further including, given a second repetition time, TR2, determining a second flip angle, flip2, and, given the second flip angle, flip2, determining the second repetition time, TR2. The MRI systems and methods still further including performing the second scan using the second repetition time, TR2, and the second flip angle, flip2, and maximizing a signal-to-noise ratio, S/N, of the second scan.

38 Claims, 3 Drawing Sheets

MAGNETIC RESONANCE IMAGING SYSTEMS AND METHODS FOR ACQUIRING MULTI-SLICE GRADIENT ECHO IMAGES

FIELD OF THE INVENTION

The present invention relates generally to magnetic resonance imaging ("MRI") systems and methods. More specifically, the present invention relates to a simplified MRI set-up and collection protocol for acquiring multi-slice gradient echo images with a T1-weighting target.

BACKGROUND OF THE INVENTION

Magnetic resonance imaging ("MRI") is a widely accepted and commercially available technique for obtaining digitized visual images representing the internal structures of objects, such as the tissues of the human body, having substantial populations of atomic nuclei that are susceptible to nuclear magnetic resonance ("NMR") phenomena. In MRI, the nuclei in a structure to be imaged are polarized by imposing a strong, uniform magnetic field, $B_0$, on the nuclei. Selected nuclei are then excited by imposing $B_1$, a radio frequency ("RF") signal at a predetermined NMR frequency. By doing this repeatedly while applying different magnetic field gradients and suitably analyzing the resulting RF responses from the nuclei, a map or image of the relative NMR responses as a function of nuclei location may be determined. Data representing the NMR responses in space may be displayed.

Referring to FIG. 1, a conventional MRI system 10 typically includes a magnet 12 operable for imposing the strong, uniform magnetic field $B_0$, a plurality of gradient coils 14 operable for imposing the magnetic field gradients in three (3) orthogonal coordinates, and a plurality of RF coils 16 operable for transmitting and receiving RF signals to and from the selected nuclei. The RF coils 16 may be used for transmitting, receiving, or both. The NMR signal received by each RF coil 16 is transmitted to a computer 18 operable for processing the data into an image on a display 20. The MR image is composed of picture elements referred to as "pixels." The intensity of a given pixel is proportional to the NMR signal intensity of the contents of a corresponding volume element or "voxel" of the structure being imaged. The computer 18 also controls the operation of the gradient coils 14 and the RF coils 16 through a plurality of gradient amplifiers 22 and an RF amplifier/detector 24, respectively.

Each voxel of an image of the human body contains one or more tissues. These tissues contain primarily fat and water, which, in turn, include a plurality of hydrogen atoms. In fact, the human body is approximately 63% hydrogen atoms. Because hydrogen nuclei have a readily discernible NMR signal, MRI of the human body primarily images the NMR signal from the hydrogen nuclei.

In NMR, the strong, uniform magnetic field $B_0$ is employed to align nuclei that have an odd number of protons and/or neutrons, such that the nuclei have a spin angular momentum and a magnetic dipole moment. The magnetic field(s) $B_1$, applied as a single pulse transverse to the strong, uniform magnetic filed $B_0$, pump energy into the nuclei, causing the angular orientation of the nuclei to flip by, for example, 90 degrees or 180 degrees. Following this excitation, the nuclei precess and gradually relax into alignment with the strong, uniform magnetic field $B_0$. As they precess and relax, the nuclei emit energy in the form of weak but detectable free induction decay ("FID"). These FID signals and/or RF or magnetic gradient refocused "echoes" thereof, collectively referred to as MR signals, sensed by the NMR imaging system are analyzed by the computer 18 and used to produce images of, for example, a structure of the human body.

The excitation frequency and the FID frequency are related by the Larmor equation. This equation states that the angular frequency, $\omega_0$, of the precession of the nuclei is the product of the strong, uniform magnetic field $B_0$ and the so-called magnetogyric ratio, $\gamma$, a fundamental physical constant for each nuclear species:

$$\omega_0 = B_0 \gamma. \quad (1)$$

By superimposing a linear magnetic field gradient, $B_z = Z G_z$, on the strong, uniform magnetic field $B_0$, which is typically defined as the Z-axis, for example, nuclei in a selected X-Y plane may be excited by the appropriate choice of the frequency of the transverse excitation field applied along the X or Y axis. Similarly, a magnetic field gradient may be applied in the X-Y plane during the detection of the MR signals to spatially localize emitted MR signals from the selected X-Y plane according to their frequency and/or phase.

Typically, an MRI operator sets a repetition time, TR, and a flip angle of multi-slice gradient echo MR images, or of a given scan. Predetermined TR values allow for the completion of the scan in a minimum amount of time. These TR values depend upon, among other things, the number of slices to be imaged. In general, relatively longer or higher TR values provide a relatively higher signal-to-noise ratio, S/N, in the images. One problem, however, is that changing the TR value may change the image contrast, often in an undesirable way. This contrast may be restored to the contrast associated with an original, desirable scan with a known TR value and flip angle, however this may take relatively more time. In general, it is desirable to minimize MRI set-up and acquisition times, while maintaining a relatively high S/N and a contrast similar to that of a target image. Thus, the conventional trial-and-error approach to selecting a TR value and a flip angle is undesirable.

Elaborating on the above, it is often desirable to change the TR of a sequence of MR images, preferably without changing the contrast of the images. Typically, this is done to reduce the time required to complete a scan. For example, given a 256-matrix with a TR of about 0.125 seconds, an imaging time of about 32 seconds is required. Further, given the fact that an echo time, TE, and other necessary delays are such that the MRI system has an inter-slice delay of about 0.025 seconds, as many as five (5) slices may be imaged simultaneously, but no more.

Suppose that the simultaneous imaging of six (6) slices is desired. Because six slices may not be fit into the TR of about 0.125 seconds, the additional slice requires repeating the scan, reducing the time efficiency of the scan to approximately 60%. However, increasing TR by a factor of about 6/5 allows all of the slices to be imaged in about 38 seconds. In other words, increasing TR to about 0.15 seconds allows the desired images to be produced approximately 67% faster than is possible at a TR of about 0.125 seconds.

Suppose that the imaging of fifteen (15) slices is desired. Assuming the same TR as above, it takes about 96 seconds to image the fifteen slices. Five (5) slices are imaged during the first 32 seconds, five (5) slices are imaged during the second 32 seconds, and five (5) slices are imaged during the third 32 seconds. Alternatively, the fifteen slices could be imaged in the same 96 seconds, fifteen at a time, if the TR is tripled. Tripling the TR, in this case, would provide a considerable increase in S/N.

The relationship between signal intensity and relaxation determines the image contrast (T1 contrast or T1-weighting in the case of longitudinal relaxation). Although there is no universally accepted definition of T1-weighting, an image is said to be strongly or heavily T1-weighted if the T1 differences among imaged regions lead to large intensity differences among the regions. It is often desirable, for example, to minimize this T1-weighting.

Because the signal intensity associated with an image is proportional to the longitudinal magnetization present immediately prior to the introduction of the RF excitation pulses, Mz, a relatively simple equation for Mz is typically used to predict contrast:

$$Mz=(1-\exp(-rTR))/(1-\cos(\text{flip})\exp(-rTR)). \quad (2)$$

(See also Equation 5). Here, Mz is normalized to "1" following an infinite wait and the relaxation rate, r, is 1/T1. The effects of T2 and T2* have been stripped from this equation. The flip angle is assumed to be constant across the thickness of the excited slice. Often, the TR may be varied without significantly affecting the contrast. Increasing the TR at a constant flip angle changes the Mz versus r plot significantly, as does increasing the flip angle at a constant TR. However, a coordinated change in the TR and the flip angle has a relatively small effect on the contrast. Thus, a method is needed to determine the appropriate flip angle to produce a desired contrast at a desired TR, and to choose the appropriate TR should a different flip angle be desired.

Increasing the TR may increase S/N, particularly when the flip angle is also increased. Consider again the fifteen (15)-slice case. Tripling the TR while increasing the flip angle from 20 to 35 degrees leaves Mz and the contrast essentially unchanged. The largest Mz difference these changes may cause, for example, is 0.035 at T1=⅓ seconds. Starting with the same Mz, the 35 degree pulse produces relatively more signal by the ratio sin(35 degrees)/sin(20 degrees), or 1.677 (where Mz is not substantially preserved, as for relatively large TR changes, the ratio of sines does not accurately indicate signal change).

Thus, what is needed are automated systems and methods that allow an MRI operator to quickly and easily set up and complete a scan using a computer, incorporating parameters, including TR values and flip angles, from a previous scan that has a desired contrast. This would allow the MRI operator to obtain high-S/N images with the desired contrast in the minimum amount of set-up and scan time.

BRIEF SUMMARY OF THE INVENTION

In various embodiments of the present invention, a simplified magnetic resonance imaging ("MRI") set-up and collection protocol is provided for acquiring multi-slice gradient echo images with a T1-weighting target. Advantageously, the automated systems and methods of the present invention allow an MRI operator to quickly and easily set up a scan using a computer, incorporating parameters, such as TR values and flip angles, from a previous scan that has a desired contrast. This allows the MRI operator to obtain relatively high signal-to-noise ratio, S/N, images with the desired contrast in a minimum amount of time. In other words, the systems and methods of the present invention allow the MRI operator to set up a scan with a predetermined number of slices and maintain approximately the same T1-weighting as a reference scan that has a given TR value and a given flip angle. Thus, the systems and methods of the present invention determine the TR value and flip angle that provide a time efficient scan with a desired contrast and a relatively high S/N.

In one embodiment of the present invention, a magnetic resonance imaging ("MRI") method for acquiring gradient echo images having a substantially constant T1-weighting includes selecting a first scan that has a desired image characteristic associated with T1-weighting and, given a first repetition time, TR1, and a first flip angle, flip1, associated with the first scan, selecting a function that provides the desired image characteristic. The method also includes holding the function substantially constant in relation to a second scan and, given a second repetition time, TR2, determining a second flip angle, flip2. The method further includes performing the second scan using the second repetition time, TR2, and the second flip angle, flip2.

In another embodiment of the present invention, a magnetic resonance imaging ("MRI") system operable for acquiring gradient echo images having a substantially constant T1-weighting includes a first algorithm operable for selecting a first scan comprising a desired image characteristic associated with T1-weighting and, given a first repetition time, TR1, and a first flip angle, flip1, associated with the first scan, a second algorithm operable for selecting a function that provides the desired image characteristic. The system also includes means for holding the function substantially constant in relation to a second scan and, given a second repetition time, TR2, a third algorithm operable for determining a second flip angle, flip2. The system further includes a scanning system operable for performing the second scan using the second repetition time, TR2, and the second flip angle, flip2.

In a further embodiment of the present invention, a magnetic resonance imaging ("MRI") method for acquiring gradient echo images having a substantially constant T1-weighting includes selecting a repetition time, TR, providing a minimum scan time; selecting a desired effective repetition time, TReff; given TR and TReff, calculating a flip angle, flip; if flip is greater than about 90 degrees, reducing TR by a predetermined amount; and if flip is less than about 90 degrees, initiating a scan.

DETAILED DESCRIPTION OF THE INVENTION

Figure 1:
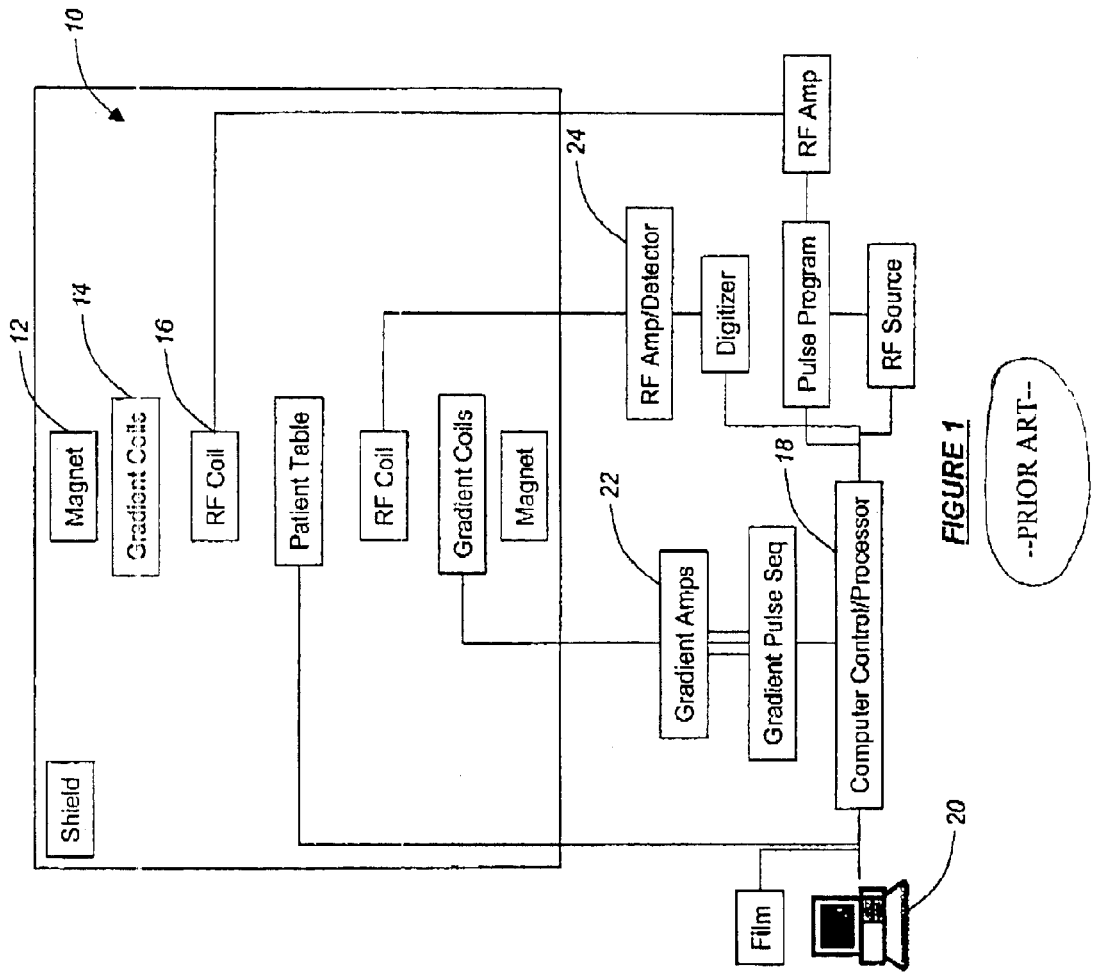
FIG. 1 is a schematic diagram of one embodiment of a conventional MRI system that may be utilized in conjunction with the MRI systems and methods of the present invention.

In various embodiments of the present invention, a simplified magnetic resonance imaging ("MRI") set-up and collection protocol is provided for acquiring multi-slice gradient echo images with a T1-weighting target. Specifically, the MRI systems and methods of the present invention are designed and intended to accomplish two objectives: 1) to provide a mathematical procedure for selecting a desirable repetition time, TR, for a given scan and 2) to provide a mathematical procedure for finding the TR-flip angle pairs that allow the contrast of the scan to match that of a previous, desirable scan (i.e., a reference scan).

Because a longer or higher TR improves the signal-to-noise ratio, S/N, of a scan, the longest or highest TR that causes the MRI system to maintain relatively continuous operation is optimal, as the time required to complete the scan is minimized. Depending upon such factors as, for example, echo time, TE, an MRI system requires a predetermined amount of time between the excitation of a first slice with a radio frequency ("RF") pulse and the excitation of a second slice with an RF pulse. Multiplying this predetermined amount of time by the number of slices to be incorporated in an image provides an adequate first estimation of an appropriate TR. For example, if a 25 millisecond interval is required between the excitation of successive slices, TR=n 25 milliseconds, where n is the number of slices.

The excitation of one slice, however, may affect the spins of the nuclei of atoms just outside of and substantially adjacent to that slice. Thus, it may be preferable to initially excite half of the slices, leaving gaps between them. The slices that lie in the gaps may then subsequently be imaged. In accordance with this method, n/2 is used (rounding n/2 up if n is an odd number) to calculate an appropriate TR. If TR is low relative to T1, S/N may be relatively low. However, if TR is high relative to T1, there is no advantage associated with increasing TR further. Likewise, maintaining a predetermined T1-weighting at a plurality of values of TR may be more accurately and effectively accomplished for smaller changes in TR. Real solutions for a flip angle may not exist for changes in TR that are too large.

In practice, an MRI operator may specify a TR and a flip angle that provide an acceptable contrast and allow the MRI system to modify these values to increase the S/N or improve the efficiency of the scan. The systems and methods of the present invention eliminate the need for the MRI operator to consult MRI system-generated recommendations for TR and for limits on the number of slices permissible with maximum efficiency. The MRI operator may refer to an existing protocol with a given TR and a given flip angle, or may specify the value of a function of TR and flip angle that provides acceptable contrast. Examples of such functions are provided herein below. The MRI operator may also refer to an existing protocol that specifies the value of the function of TR and flip angle.

Occasionally, if only one slice is desired, it is possible to select a TR so low that the S/N is poor. In accordance with the systems and methods of the present invention, the MRI operator may veto such selections, either manually or automatically. Typically, MRI systems evaluate and display a given function that estimates the relative S/N as the MRI operator modifies scan parameters. This may provide an alarm or be used to set a floor for TR.

In accordance with the systems and methods of the present invention, in order to maintain a relatively constant contrast while changing TR and the flip angle, a function of TR and the flip angle is held constant. Given a value of this function and TR, an appropriate flip angle may be determined. Alternatively, given a flip angle, an appropriate TR may also be determined. Exemplary functions are described herein below.

Assuming rTR<<1, the steady state solution of Mz after several T1 may be found using the following equation:

$$dMz/dt=0=r(1-Mz)-(1-\cos(\text{flip}))Mz/TR. \quad (3)$$

The term r(1–Mz) represents the growth of Mz according to the Bloch equations, well known to those of ordinary skill in the art. The term (1–cos(flip)) Mz/TR represents the loss in Mz caused by the RF pulses. Each RF pulse reduces Mz by the factor 1–cos(flip). Dividing by TR results in a rate of decay. At a steady state, growth and decay must be equal.

Rearranging this equation to separate r and Mz, which relate to contrast on the left, from TR and flip angle, which relate to machine settings on the right:

$$r(1-Mz)/Mz=(1-\cos(\text{flip}))/TR. \quad (4)$$

The right-hand side, (1–cos(flip))/TR, is a function of the instrument settings and is equal to a function on the left-hand side related to contrast. Thus, this is a candidate for preserving contrast as TR changes. A TR of 0.125 seconds with a flip angle of 20 degrees and a TR of 0.375 seconds with a flip angle of 35 degrees both have a (1–cos(flip))/TR of 0.482/second. Analysis demonstrates that preserving this function of TR and flip angle provides Mz versus r curves with identical slope, at the origin where r and Mz are both equal to 0.

To obtain a more simple function of TR and flip angle, the cosine is expanded to $1-\text{flip}^2/2$, suggesting holding $\text{flip}^2/TR$ constant to maintain the same contrast. Because the expansion of the cosine is accurate for relatively small angles, this function works well for relatively small flip angles.

The first function, TR/(1–cos(flip) or (1–cos(flip))/TR, works well when Mz is relatively small. Because ½ is a more typical value for Mz than 0, matching contrast at Mz=½ may be preferred. Alternatively, Mz may be matched at a particular value of r, rather than matching the slope of Mz. Specifically, it may be required that the same r gives Mz=½ for the reference scan with a desirable TR. This provides a function $(2-\cos(\text{flip}))^{1/TR}$. Similarly, $(4-3\cos(\text{flip}))^{1/TR}$ provides a match at Mz=¾. The function Fe is more general, matching Mz=mmz. Table 1 provides a plurality of functions for preserving contrast if kept constant and the associated expressions for the flip angle in terms of TR and the reference TR and the reference flip angle. TR0 is the TR of the reference scan with the desired contrast, c is the cos(flip), c0 is the cosine of the flip angle of the reference scan, flip0 is the flip angle of the reference scan, and t is TR.

TABLE 1

Functions for Preserving Contrast

| Funtion | Function to Preserve | Expression for Flip Angle |
|---|---|---|
| Fa | t/(1 − c) | arccos(1 − (1 − c0) t/t0) |
| Fb | t/flip$^2$ | flip0(t/t0)$^{1/2}$ |
| Fc | (2 − c)$^{1/t}$ | arccos(2 − (2 − c0)$^{t/t0}$) |
| Fd | (4 − 3c)$^{1/t}$ | arccos((4 − (4 − 3c0)$^{t/t0}$)/3) |
| Fe | ((−1 + c mmz)/ (−1 + mmz))$^{1/t}$ | arcos((1 + (−1 + mmz)((−1 + c0 mmz)/ (−1 + mmz))$^{t/t0}$)/mmz) |

Thus, although the T1-weighting of a gradient echo image is typically described qualitatively, the systems and methods of the present invention characterize the T1-weighting quantitatively using a single parameter, effective TR. Effective TR is the TR that, with a 90 degree observe pulse, provides the same T1-weighting that a reference image has. The use of an effective TR allows for the adjustment of TR and flip angle to preserve an original, desirable contrast, and for the maximization of S/N as imaging time and/or coverage requirements change. Increasing coverage has no effect on S/N if TR and flip angle are kept constant. Using an effective TR, increasing coverage increases S/N. The systems and methods of the present invention eliminate the problem in multi-slice MRI imaging that adding a slice may double the time required to complete a scan.

As described above, a suitable definition of effective TR is TReff=TR/(1–cos(flip)). Using effective TR=TR/(1–cos (flip)), tripling coverage from five (5) to fifteen (15) slices while holding the effective TR constant increases S/N by approximately 70% (demonstrated experimentally) but changes the intensity ratios of, for example, muscle, cartilage, and marrow by less than about 5%. Larger coverage increases may raise S/N more.

As described above, T1-weighting is the relation of pixel value, or the magnetization that leads to it, to tissue T1. The expressions, "strongly T1-weighted," "heavily T1-weighted," "weakly T1-weighted," and "lightly T1-weighted" are of limited value in planning gradient echo scans. With spin echo images, however, TR (or TR−TE) relatively simply and usefully describes T1-weighting. MRI operators inherently have a sense for the contrast that a given TR will bring. It is apparent how to increase or decrease T1-weighting and any necessary trial-and-error represents a search in a one-dimensional space. Gradient echo scans, however, are more complicated because both TR and flip angle affect T1-weighting.

Given a reference gradient echo image that has a desirable contrast, an MRI operator may use the same TR and flip angle to achieve the same T1-weighting and S/N. In multi-slice imaging, however, this has two disadvantages. Acquiring an extra slice may double the acquisition time, reducing the average number of slices acquired per minute. Increasing the number of slices by an integer factor does not decrease efficiency, but, unless TR or flip angle are adjusted, it passes up the opportunity to increase S/N. Thus, given a reference image or T1-weighting target and the number of slices required, it is desirable to find the combination of TR and flip angle that provides the reference T1-weighting without wasting time or passing up potential S/N gains.

In accordance with the methods of the present invention, an MRI operator first determines, taking time constraints into account, the longest or highest TR that allows imaging in the shortest amount of time. This works out to collecting data from all slices at once, rather than finishing selected slices before starting other slices. Knowing the associated TR and T1-weighting target, the flip angle is then determined. If the T1-weighting target is not initially known, it may be calculated from TR and the flip angle of the reference scan. This T1-weighting may be described by a scalar, simplifying communication related to the gradient echo methods.

Figure 2:
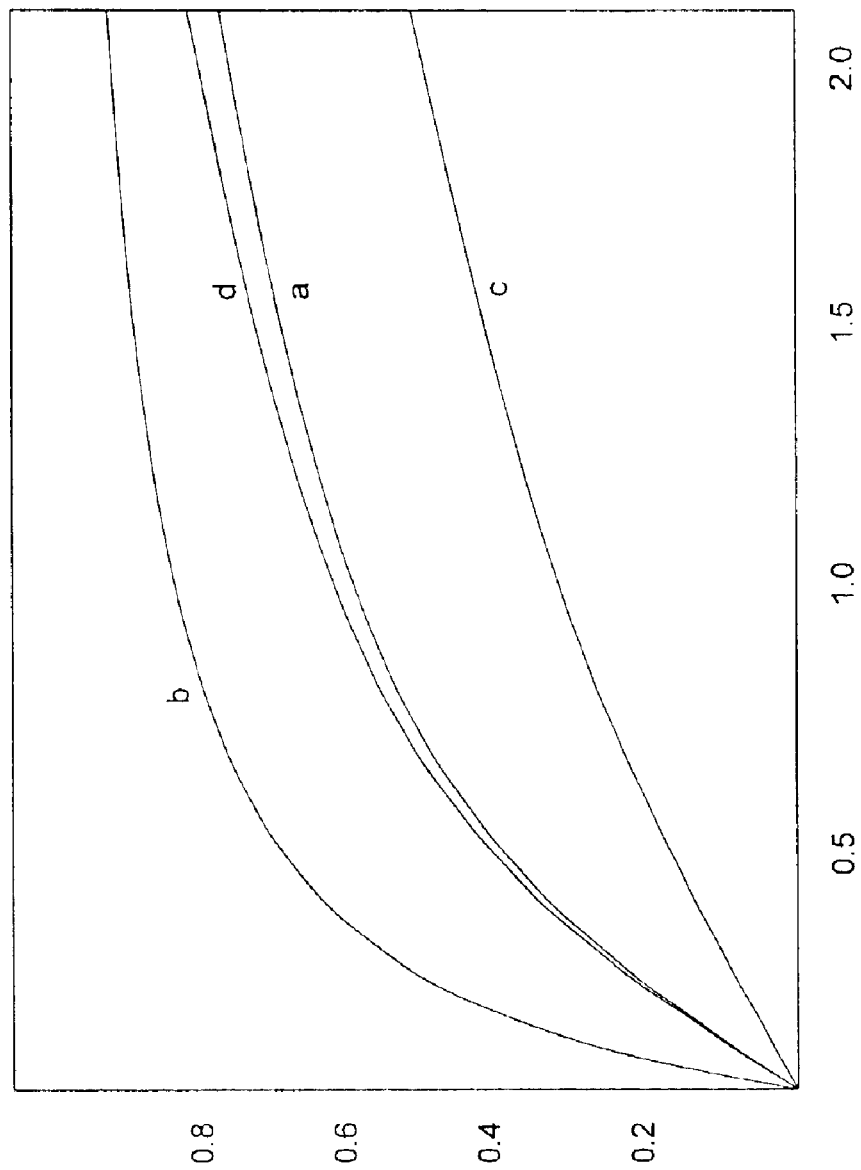
FIG. 2 is a plot of magnetization, Mz, versus 1/T1 for selected repetition time, TR, flip angle, and effective repetition time, TReff, parameters, illustrating the behavior of the systems and methods of the present invention.

As described above, T1-weighting is the effect that T1 has on image intensity, or on the magnetization, Mz, that produces it. The Bloch equations provide the following relationship:

$$Mz=(1-\exp(-rTR))/(1-\cos(\text{flip})\exp(-rTR)), \quad (5)$$

ignoring proton density, T2, MTC, flow, and the like, and letting $r=1/T1$ (see also Equation 2). This relationship is illustrated in FIG. 2. Referring to FIG. 2, a faster relaxation, r, provides relatively more Mz, thus curves go up and to the right. There are an infinite number of possible curves, one for each possible combination of TR and flip. Table 2 provides the parameters for the four illustrative curves shown in FIG. 2.

TABLE 2

TR, Flip Angles, and TReff for the Curves of FIG. 1
(TReff = TR/(1 − cos(flip)))

| Curve | TR (seconds) | Flip Angle | TReff (seconds) |
|---|---|---|---|
| a | 1/8 | 20 | 2.07 |
| b | 3/8 | 20 | 6.22 |
| c | 1/8 | 35 | 0.69 |
| c | 3/8 | 35 | 2.07 |

If no curves relating intensity to T1 crossed, a single parameter would fully specify the T1-weighting of any given gradient echo sequence. Examples of such parameters include the TR that, with a 90 degree flip angle, provides the same contrast as the scan sequence in question (the effective repetition time, TReff, herein), or the relaxation rate, r, that makes Mz one half (the half rate of Mz). Mz versus 1/T1 curves may cross, but because they do so relatively infrequently, a single parameter characterizes T1-weighting adequately and is useful. In the working example below, TR/(1−cos(flip)) is used.

WORKING EXAMPLE

Images were obtained using a 1.5T Signa scanner (GE Medical Systems, Waukesha, Wis.) with a dedicated knee coil. The images were gradient echo images with Cartesian k-space paths and a $256^2$ matrix. The bandwidths were about 20.8 kHz.

Assuming 0.125 seconds for the TR of curve (a) of FIG. 2 and Table 2, five (5) slices may be imaged with a 256-matrix simultaneously in 32 seconds with a desired contrast. To acquire fifteen (15) slices, one could image five (5) slices at a time in 3×32 seconds without changing the TR, flip angle, contrast, or S/N. Alternatively, imaging fifteen (15) slices simultaneously with a long or high TR takes the same amount of time as three (3) sets of five (5) slices with shorter or lower TR. However, according to equation (5), increasing the TR while leaving the flip angle at 20 degrees results in curve (b) of FIG. 2.

In accordance with the systems and methods of the present invention, two steps are necessary to determine the flip angle that provides the contrast of curve (a), approximated by curve (d), with triple the TR. First, TReff is determined for the initial scan sequence. Table 3 provides an appropriate mathematical expression (symbols are described in relation to Table 1 above).

TABLE 3

More Functions for Preserving Contrast

| Function | Effective TR (TReff) | What is Preserved? |
|---|---|---|
| Fa | t0/(1 − c0) | Slope at origin |
| Fb | $t0/\text{flip0}^2$ | Fa, low flip angle limit |
| Fc | t0 log (2)/log (2 − c0) | 1/T1 at Mz = 1/2 |
| Fd | t0 log (4)/log (4 − 3c0) | 1/T1 at Mz = 3/4 |
| Fe | t0/[1 − (log (1 − c0 mmz)/ log (1 − mmz))] | 1/T1 at Mz = mmz |

Table 2 provides the value of the effective TR, 2.07 seconds. Then, using Table 1, the flip angle corresponding to 0.375 seconds for TR and 2.07 seconds for TReff is found. The expression for flip angle in Table 1 above requires t, t0, and c0. These are 0.375 seconds, and because letting TR=TReff when the flip angle is 90 degrees gives the desired T1-weighting, t0=2.07 seconds and c0=0. Referring again to FIG. 2, the new value of TR gives curve (d) when the flip angle is 35 degrees. Curve (d) has slightly more Mz than curve (a), but is within about 0.03 of it for a given T1.

Figure 3:
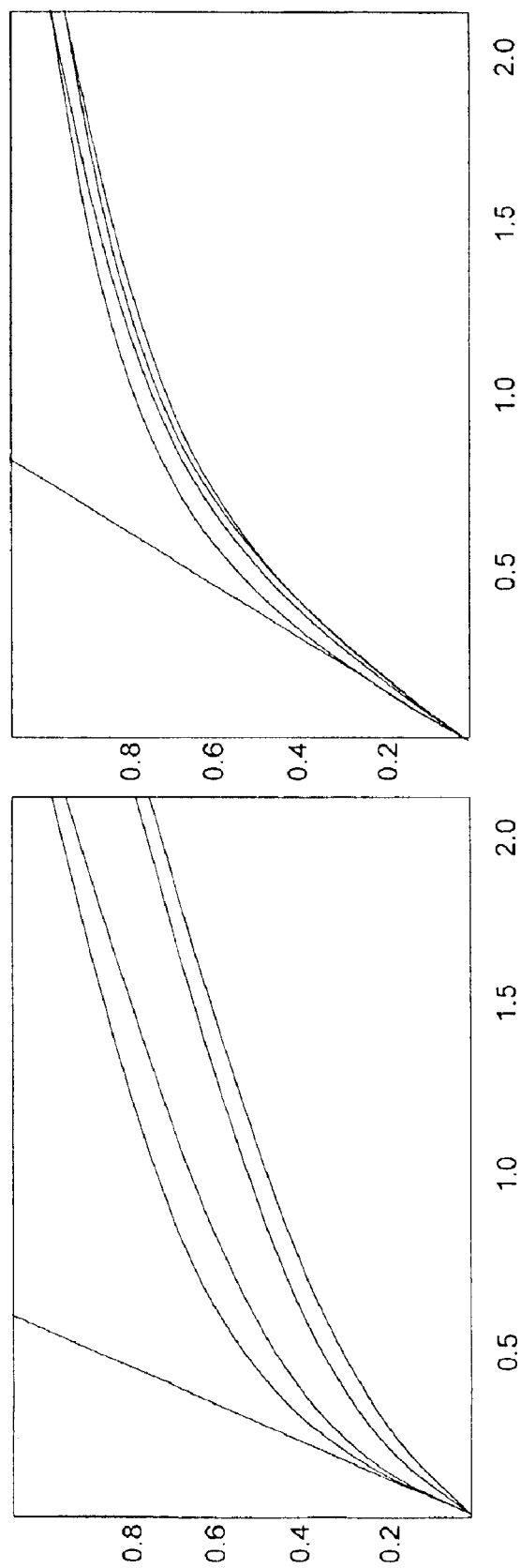
FIG. 3 is also a plot of magnetization, Mz, versus 1/T1 for selected repetition time, TR, flip angle, and effective repetition time, TReff, parameters, illustrating the use of different functions associated with the systems and methods of the present invention.

Although increasing TR and the flip angle have an imperceptible effect on Mz and contrast, S/N increases. Assuming no Mz change, the signal is proportional to the sine of the flip angle. Thus, S/N increases by a factor of sin(35 degrees)/sin(20 degrees), or 1.68. Referring to FIG. 3, even when compensating for changes in the flip angle, relatively large changes in TR cause relatively larger changes in T1-weighting than exhibited in the example.

Tripling coverage and TR for knee imaging (FIGS. 2 and 3 and Tables 1, 2, and 3) illustrates how treating T1-weighting quantitatively may improve S/N without trial-and-error inefficiencies. For this relatively small change, there was close agreement between the expected S/N improvement, sin(35 degrees)/sin(20 degrees) or 1.68, the observed improvements, 1.75, 1.65, and 1.71, for muscle, marrow, and cartilage, respectively, and the $3^{1/2}$ or 1.73 naively expected for tripling TR. Contrast changes were minimal, as desired. Intensity ratios of the tissues imaged remained within approximately 4% of the original values.

Common experience teaches that no flip angle may give a heavy T1-weighting with a 10 second TR. The methods of Tables 1 and 3 indicate that this would require $\cos(\text{flip}) < -1$. The flip angle, however, is limited to less than 180 degrees. Even when a flip angle approaching 180 degrees does give the desired contrast, S/N will be poor because transverse magnetization depends on the sine of the flip angle. In such cases, it is preferable to cut TR in half, finish imaging half of the slices before starting the other half, and use the smaller flip angle indicated for half of the TR. Based upon the assumption that preserving function Fa in Tables 1 and 3 keeps all Mz substantially the same, splitting the slices into two (or more) groups becomes advantageous from a S/N standpoint when the flip angle exceeds $\arccos(-1/3)$, the tetrahedral angle or 109 degrees. Other factors may favor splitting into groups before reaching 109 degrees. Acquiring every signal twice with half of the TR reduces some random artifact intensity, when expressed as a fraction of the desired signal, by $2^{1/2}$. Other artifacts may cancel completely with proper phase alternations. Restricting flip angles to 90 degrees may be prudent.

In two-dimensional ("2D") imaging, the edges of slices receive less than the nominal flip angle. This admixture of signal from low flip angle regions reduces the T1-weighting. Modeling this is relatively difficult and requires assumptions about slice profile. Rectangular slice profiles have been assumed. Even with perfect RF pulses and exact Bloch equations, holding the TReff function constant cannot keep T1-weighting exactly the same. For small changes in TR, such as the 3-fold example above, the differences, however, are very small. The maximum Mz difference between curves (a) and (d) in FIG. 2 is about 0.03.

For large coverage and TR increases, T1-weighting changes are substantial even if TReff is fixed. At a large TR, the curves approach a "hockey stick" with a "shaft" pointing toward Mz=1, then curving off into a "blade" parallel to Mz=1. Typically, the MR imaging goal is either minimizing or maximizing T1-weighting. Choosing a high TReff, particularly one longer than the relevant T1's, minimizes T1-weighting. Conversely, choosing a TReff shorter than T1 for tissues of interest provides maximum T1-weighting. Along the shaft of the hockey stick, where T1-weighting is desired, the error in the TReff approximation is advantageous when going to a relatively larger number of slices. It makes signals stronger and makes the curve straighter, improving the approximation that signal increase caused by a contrast agent is proportional to the agent concentration. Along the blade, where T1-weighting is to be avoided, the error in the approximation also provides for better images. Signals grow stronger as coverage increases and the curve is flatter. T1 has less effect on signal.

One may characterize T1-weighting either to ensure that there is enough weighting or that there is not too much. In the former case, TR and flip angles that keep Mz small are chosen. In the latter case, the tissues of primary concern should have large Mz. Thus, one characterizing function may be superior for one use, and another function for another use. Fa sorts curves by slope at the origin, near the operating region for strong T1-weighting. Fc and Fd deal with the portion of the curve where T1 has less effect on intensity. Fa may be more useful in planning highly T1-weighted images and Fc and Fd when T1-weighting is to be avoided.

Thus, TR and flip angle should be adjusted when coverage is changed. Given a TR and a flip that provide a desired contrast, the systems and methods of the present invention allow TR and flip angle adjustment without changing T1-weighting, but optimizing S/N and meeting time constraints. Equally important, representing T1-weighting, which is determined by two parameters, TR and flip angle, by a single parameter eliminates the need for trial-and-error in optimizing sequences, aids in copying, testing, and/or verifying another's method, and simplifies discussion among gradient echo users.

It is apparent that there has been provided, in accordance with the systems and methods of the present invention, a simplified MRI set-up and collection protocol for acquiring multi-slice gradient echo images with a T1-weighting target. Although the systems and methods of the present invention have been described with reference to preferred embodiments and examples thereof, other embodiments and examples may perform similar functions and/or achieve similar results. All such equivalent embodiments and examples are within the spirit and scope of the present invention and are intended to be covered by the following claims.

What is claimed is:

1. A magnetic resonance imaging ("MRI") method for acquiring gradient echo images having a substantially constant T1-weighting, the MRI method comprising:
   selecting a first scan comprising a desired image characteristic associated with T1-weighting;
   given a first repetition time, TR1, and a first flip angle, flip1, associated with the first scan, selecting a function that provides the desired image characteristic;
   holding the function substantially constant in relation to a second scan;
   given a second repetition time, TR2, determining a second flip angle, flip2, wherein the first flip angle, flip1 is defferent from the second flip angle, flip2; and
   performing the second scan using the second repetition time, TR2, and the second flip angle, flip2.

2. The MRI method of claim 1, further comprising, given the second flip angle, flip2, determining the second repetition time, TR2.

3. The MRI method of claim 1, further comprising maximizing a signal-to-noise ratio, S/N, of the second scan.

4. The MRI method of claim 1, wherein the desired characteristic associated with T1-weighting comprises contrast.

5. The MRI method of claim 1, wherein the function comprises an effective repetition time, TReff.

6. The MRI method of claim 5, wherein the function comprises the function TR/(1−cos(flip)).

7. The MRI method of claim 6, comprising determining the second flip angle, flip2, using the expression arccos(1−(1−cos(flip0))TR/TR0).

8. The MRI method of claim 5, wherein the function comprises the function TR/flip$^2$.

9. The MRI method of claim 8, comprising determining the second flip angle, flip2, using the expression flip0(TR/TR0)$^{1/2}$.

10. The MRI method of claim 5, wherein the function comprises the function $(2-\cos(\text{flip}))^{1/TR}$.

11. The MRI method of claim 10, comprising determining the second flip angle, flip2, using the expression arccos(2−(2−cos(flip0))$^{TR/TR0}$).

12. The MRI method of claim 5, wherein the function comprises the function $(4-3\cos(\text{flip}))^{1/TR}$.

13. The MRI method of claim 12, comprising determining the second flip angle, flip2, using the expression arccos((4−(4−3cos(flip0))$^{TR/TR0}$)/3).

14. The MRI method of claim 5, wherein the function comprises the function $((-1+\cos(\text{flip})\text{mmz})/(-1+\text{mmz}))^{1/TR}$.

15. The MRI method of claim 14, comprising determining the second flip angle, flip2, using the expression arccos((1+(−1+mmz)((−1+cos(flip0)mmz)/(−1+mmz))$^{TR/TR0}$)/mmz).

16. The MRI method of claim 1, wherein the first scan comprises a first plurality of slices.

17. The MRI method of claim 16, wherein the second scan comprises a second plurality of slices.

18. A magnetic resonance imaging ("MRI") method for acquiring multi-slice gradient echo images having a substantially constant T1-weighting, the MRI method comprising:

selecting a first scan comprising a desired contrast associated with T1-weighting;

given a first repetition time, TR1, and a first flip angle, flip1, associated with the first scan, selecting an effective repetition time, TReff, that provides the desired contrast;

holding the effective repetition time, TReff, substantially constant in relation to a second scan;

given a second repetition time, TR2, determining a second flip angle, flip2;

given the second flip angle, flip2, determining the second repetition time, TR2;

performing the second scan using the second repetition time, TR2, and the second flip angle, flip2; and maximizing a signal-to-noise ratio, S/N, of the second scan.

19. A magnetic resonance imaging ("MRI") system operable for acquiring gradient echo images having a substantially constant T1-weighting, the MRI system comprising:

a first algorithm operable for selecting a first scan comprising a desired image characteristic associated with T1-weighting;

given a first repetition time, TR1, and a first flip angle, flip1, associated with the first scan, a second algorithm operable for selecting a function that provides the desired image characteristic;

means for holding the function substantially constant in relation to a second scan;

given a second repetition time, TR2, a third algorithm operable for determining a second flip angle, flip2; and a scanning system operable for performing the second scan using the second repetition time, TR2, and the second flip angle, flip2.

20. The MRI system of claim 19, further comprising, given the second flip angle, flip2, a fourth algorithm operable for determining the second repetition time, TR2.

21. The MRI system of claim 19, further comprising a fifth algorithm operable for maximizing a signal-to-noise ratio, S/N, of the second scan.

22. The MRI system of claim 19, wherein the desired characteristic associated with T1-weighting comprises contrast.

23. The MRI system of claim 19, wherein the function comprises an effective repetition time, TReff.

24. The MRI system of claim 23, wherein the function comprises the function TR/(1−cos(flip)).

25. The MRI system of claim 24, comprising determining the second flip angle, flip2, using the expression arccos(1−(1−cos(flip0))TR/TR0).

26. The MRI system of claim 23, wherein the function comprises the function TR/flip$^2$.

27. The MRI system of claim 26, comprising determining the second flip angle, flip2, using the expression flip0(TR/TR0)$^{1/2}$.

28. The MRI system of claim 23, wherein the function comprises the function $(2-\cos(\text{flip}))^{1/TR}$.

29. The MRI system of claim 28, comprising determining the second flip angle, flip2, using the expression arccos(2−(2−cos(flip0))$^{TR/TR0}$).

30. The MRI system of claim 23, wherein the function comprises the function $(4-3\cos(\text{flip}))^{1/TR}$.

31. The MRI system of claim 30, comprising determining the second flip angle, flip2, using the expression arccos((4−(4−3cos(flip0))$^{TR/TR0}$)/3).

32. The MRI system of claim 23, wherein the function comprises the function $((-1+\cos(\text{flip})\text{mmz})/(-1+\text{mmz}))^{1/TR}$.

33. The MRI system of claim 32, comprising determining the second flip angle, flip2, using the expression arccos((1+(−1+mmz)((−1+cos(flip0)mmz)/(−1+mmz))$^{TR/TR0}$)/mmz).

34. The MRI system of claim 19, wherein the first scan comprises a first plurality of slices.

35. The MRI system of claim 34, wherein the second scan comprises a second plurality of slices.

36. A magnetic resonance imaging ("MRI") system operable for acquiring multi-slice gradient echo images having a substantially constant T1-weighting, the MRI system comprising:

a first algorithm operable for selecting a first scan comprising a desired contrast associated with T1-weighting;

given a first repetition time, TR1, and a first flip angle, flip1, associated with the first scan, a second algorithm operable for selecting an effective repetition time, TReff, that provides the desired contrast;

means for holding the effective repetition time, TReff, substantially constant in relation to a second scan;

given a second repetition time, TR2, a third algorithm operable for determining a second flip angle, flip2;

given the second flip angle, flip2, a fourth algorithm operable for determining the second repetition time, TR2;

a scanning system operable for performing the second scan using the second repetition time, TR2, and the second flip angle, flip2; and a fifth algorithm operable for maximizing a signal-to-noise ratio, S/N, of the second scan.

37. A magnetic resonance imaging ("MRI") method for acquiring gradient echo images having a substantially constant T1-weighting, the MRI method comprising:

selecting a repetition time, TR, providing a minimum scan time;

selecting a desired effective repetition time, TReff;

given TR and TReff, calculating a flip angle, flip;

if flip is greater than about 90 degrees, reducing TR by a predetermined amount; and if flip is less than about 90 degrees, initiating a scan.

38. A magnetic resonance imaging ("MRI") system operable for acquiring gradient echo images having a substantially constant T1-weighting, the MRI system comprising:

a first algorithm operable for selecting a repetition time, TR, providing a minimum scan time;

a second algorithm operable for selecting a desired effective repetition time, TReff;

means for calculating a flip angle, flip, given TR and TReff;

a fourth algorithm operable for reducing TR by a predetermined amount, if flip is greater than about 90 degrees; and a fifth algorithm operable for initiating a scan, if flip is less than about 90 degrees.

* * * * *

UNITED STATES PATENT AND TRADEMARK OFFICE
CERTIFICATE OF CORRECTION

PATENT NO. : 6,914,428 B2 Page 1 of 1
APPLICATION NO. : 10/219883
DATED : July 5, 2005
INVENTOR(S) : Dixon et al.

It is certified that error appears in the above-identified patent and that said Letters Patent is hereby corrected as shown below:

Colume 2:
Line 51, after "not" delete "be"

Column 3:
Line 48, before "SUMMARY" delete "BRIEF"

Signed and Sealed this

Thirteenth Day of March, 2007

JON W. DUDAS
*Director of the United States Patent and Trademark Office*